United States Patent [19]

Iwanishi

[11] Patent Number: 4,801,995
[45] Date of Patent: Jan. 31, 1989

[54] SEMICONDUCTOR DEVICE

[75] Inventor: Masaaki Iwanishi, Himeji, Japan

[73] Assignee: Kabushiki Kaisha Toshiba, Kawasaki, Japan

[21] Appl. No.: 811,713

[22] Filed: Dec. 20, 1985

[30] Foreign Application Priority Data

Dec. 28, 1984 [JP] Japan .................................. 59-279939

[51] Int. Cl.⁴ .................... H01L 29/34; H01L 29/72; H01L 27/02; H01L 29/40
[52] U.S. Cl. ........................................ 357/52; 357/34; 357/35; 357/51; 357/53
[58] Field of Search ................. 357/34, 35, 52, 51, 357/53

[56] References Cited

U.S. PATENT DOCUMENTS

| | | | |
|---|---|---|---|
| 3,728,166 | 4/1973 | Bardell, Jr. et al. | 357/34 |
| 3,740,621 | 6/1973 | Carley | 357/34 |
| 3,911,473 | 10/1975 | Nienhuis | 357/53 |
| 4,003,072 | 1/1977 | Matsushita et al. | 357/34 |
| 4,071,852 | 1/1978 | Kannam | 357/34 |
| 4,143,392 | 3/1979 | Mylroie | 357/34 |
| 4,377,029 | 3/1983 | Ozawa | 357/51 |
| 4,437,107 | 3/1984 | Jonsson et al. | 357/53 |
| 4,599,638 | 7/1986 | Flohrs | 357/53 |
| 4,691,223 | 9/1987 | Murakami et al. | 357/34 |
| 4,695,867 | 9/1987 | Flohrs et al. | 357/53 |

FOREIGN PATENT DOCUMENTS 53-142878 12/1978 Japan ..................................... 357/52

Primary Examiner—Andrew J. James
Assistant Examiner—Gregory Key
Attorney, Agent, or Firm—Finnegan, Henderson, Farabow, Garrett & Dunner

[57] ABSTRACT

A semiconductor device includes a metal film, not in ohmic contact with a guard ring region (a second region). The metal film is formed on that surface portion of an insulating film under which the guard ring region is formed to surround a base region (a first region) of a planar transistor. In this arrangement, a planar semiconductor device with a high withstand voltage, which is free of short-circuiting between electrodes upon the measurement of the withstand voltage and involves no degeneration of the withstand voltage resulting from an atmospheric humidity, can be obtained. The metal film, which is not in contact with the guard ring region, is "electrically floated", i.e., is not in contact with any area inclusive of the guard ring region.

15 Claims, 2 Drawing Sheets

SEMICONDUCTOR DEVICE

BACKGROUND OF THE INVENTION

This invention relates to a semiconductor device and, more particularly, a high withstand-voltage planar transistor device.

In this field, a so-called guard ring type element structure is known as an element structure for implementing a high withstand voltage on a bipolar planar semiconductor device, such as a planar diode and planar transistor (see Japanese Patent Publication (Kokoku) No. 40-12739).

A known guard ring type planar transistor includes a guard ring region. Upon the application of a bias potential to the base region a space charge area formed around the base region reaches the guard ring region. In consequence, it is possible to increase the withstand voltage on a junction in the neighborhood of the surface of the base region and thus to enhance the withstand voltage of the transistor in comparison with a planar transistor having no guard ring region.

However, the semiconductor device of this type is susceptible to a prevailing atmospheric humidity. Under a high-temperature and high-humidity atmosphere the surface portion of the guard ring region is readily inverted from a P type to an N type due to the prevailing atmospheric humidity, resulting in a loss of the effect of such a guard ring structure and a consequent liability to a lowered withstand voltage.

In order to eliminate such drawbacks, a planar transistor has been proposed in which three guard ring regions are provided, the middle guard ring region of which ohmic-contacts with the corresponding electrode formed on an insulating film. This arrangement permits an improvement in the degradation of the withstand voltage resulting from the atmospheric humidity, but a spark is liable to occur between electrodes upon the measurement of the withstand voltage, thus involving a greater danger of an element breakage.

SUMMARY OF THE INVENTION

It is, accordingly, an object of this invention to provide an improved semiconductor device free of the above-mentioned drawbacks encountered in a conventional semiconductor device.

Another object of this invention is to provide an improved planar semiconductor device which is free of a withstand voltage degradation resulting from an atmospheric humidity and from an electrical shorting occurring between electrodes upon the measurement of the withstand voltage.

A semiconductor device of this invention is characterized by a metal film which is not ohmic contact with a guard ring region (a second region). This metal film is formed on that surface portion of an insulating film under which the guard ring region is formed in a manner to surround a base region (a first region) of a planar transistor. In this arrangement a planar semiconductor device with a high withstand voltage, which is free of short-circuiting between electrodes upon the measurement of the withstand voltage and involves no degeneration of the withstand voltage resulting from an atmospheric humidity, can be obtained.

In the semiconductor device of this invention the metal film, not in contact with the guard ring region, is "electrically floated", i.e., is not in contact with any area inclusive of the guard ring region. In this respect, the metal film can be distinguished from a known field plate as disclosed, for example, in Japanese Patent Publication (Kokoku) Nos. 40-15139 and 39-24999.

DETAILED DESCRIPTION OF THE PREFERRED EMBODIMENTS

Figure 1:
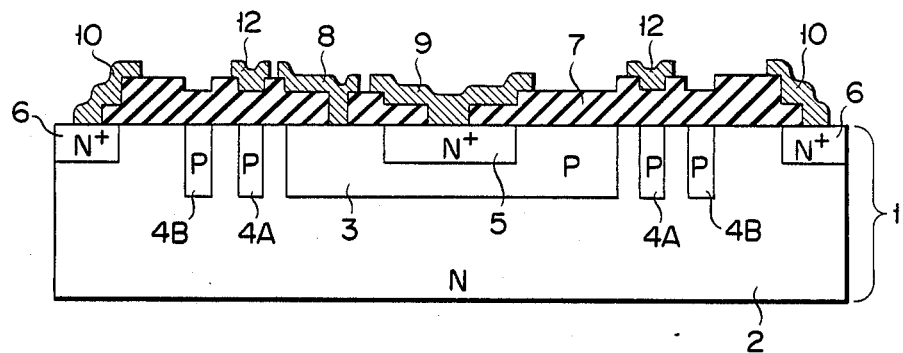
FIG. 1 is a cross-sectional view showing a semiconductor device according to an embodiment of this invention.

A semiconductor device according to an embodiment of this invention will be described below with reference to FIG. 1. For the sake of simplicity, the same reference numerals are employed to designate the same parts or elements throughout the drawings.

In FIG. 1, reference numeral 1 denotes a semiconductor substrate of an N conductivity type. Substrate 1 serves as collector region 2. Base region 3 of a P conductivity type is formed in a major surface portion of substrate 1. Guard ring regions 4A and 4B of the P conductivity type are so formed as to surround base region 3. Emitter region 5 of an N+conductivity type is formed in base region 3. Channel stopper area 6 is so formed as to surround the outer area of guard ring region 4B. Usually, base region 3 and guard ring regions 4A and 4B are formed such that they have the same conductivity type (P) and the same diffusion depth. On the other hand, emitter region 5 and channel stopper area 6 are so formed as to have the other same conductivity type (N) and the same diffusion depth. Insulating film (silicon oxide film) 7 is formed on the major surface of substrate 1 to cover the exposed surfaces of the respective regions. Base electrode 8, emitter electrode 9 and channel stopper electrode 10 are formed on insulating film 7, such that they are in ohmic contact with the corresponding regions through their corresponding contact holes formed in insulating film 7.

The semiconductor device of the embodiment shown in FIG. 1 is characterized in that metal film 12 is formed on that surface portion of insulating film 7, which metal film 12 is situated immediately above at least the innermost one (4A) of a plurality of guard ring regions (4A and 4B) and is not in contact with guard ring region 4A. In this arrangement, metal film 12 is not in ohmic contact with guard ring region 4A. From this, there is no possibility of a spark occurring between the metal film (12) and the correlating other electrode. There is no risk, either, that a polarity inversion will occur at the guard ring regions (4A, 4B) due to the prevailing humidity.

Figure 2A:
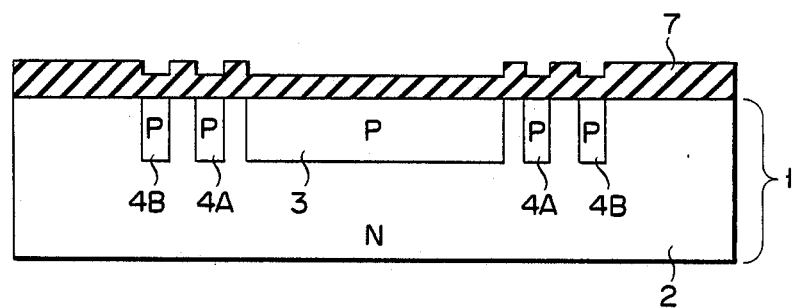
FIGS. 2A to 2C schematically illustrate the steps of manufacturing the semiconductor device shown in FIG. 1.
Figure 2B:
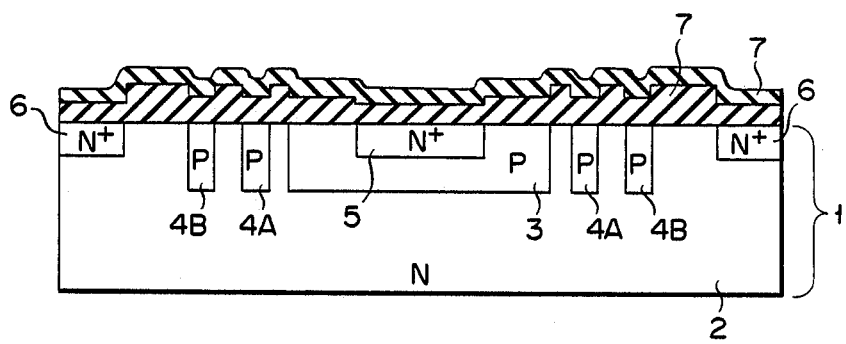
Figure 2C:
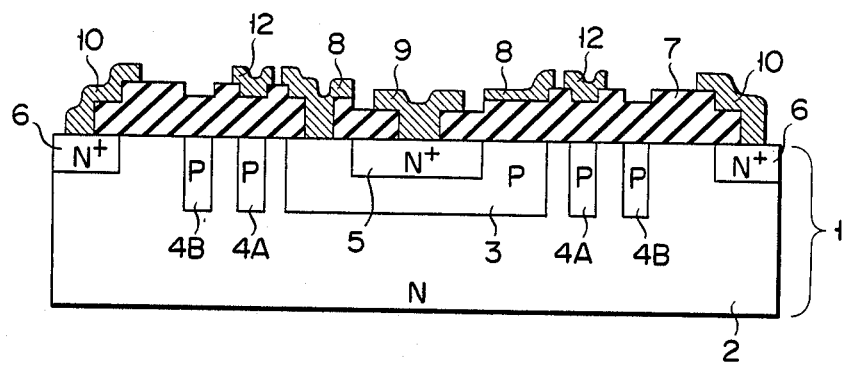

FIGS. 2A to 2C schematically show the steps of manufacturing the semiconductor device of FIG. 1. In the manufacture of the semiconductor device of this invention an insulating film (silicon oxide film) is formed on the major surface of silicon semiconductor substrate 1 of an N conductivity type as shown in FIG.

2A. Diffusion holes are formed at prescribed places in insulating film 7 by virtue of a known photo-etching process (PEP). Then, a P type impurity is ion-implanted through the diffusion holes into substrate by a known method, such as an ion-implantation, so that base region 3 and guard ring regions 4A and 4B are formed in substrate 1. Insulating film 7 is then further formed to cover the surface of the resultant structure, as shown in FIG. 2A.

Then, insulating film 7 is selectively etched by the PEP technique to provide emitter diffusion opening and channel stopper diffusion opening. An N type impurity is ion-implanted through these openings into substrate 1 to form emitter region 5 and channel stopper region 6 as shown in FIG. 2B. Then, another insulating film 7 is deposited on the surface of the resultant structure to cover these openings.

Insulating film 7 thus obtained is selectively etched by the PEP technique to provide an emitter contact hole, base contact hole and channel stopper contact hole. A metal film for electrodes is deposited by a vapor deposition method on the resultant structure, followed by etching the metal film by the PEP technique to form base electrode 8, emitter electrode 9 and channel stopper electrode 10. In this connection it is to be noted that at this time, metal film portion 12 is left on that surface portion of said another insulating film 7, which is situated immediately above but is not in ohmic contact with the innermost guard ring region (4A). In this way, a semiconductor device according to the embodiment of this invention is manufactured.

The semiconductor device of this invention (FIG. 1) and conventional semiconductor device (FIG. 4) have been tested, for change in a leakage current and occurrence of defects, under the same conditions in which they were allowed to stand under a high-temperature and high-humidity atmosphere. The results of tests are as shown in FIG. 3.

Figure 3:
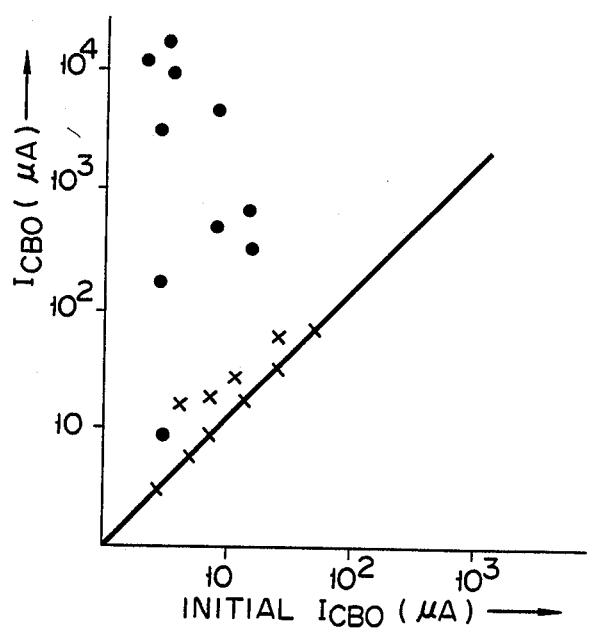
FIG. 3 is a comparison graph showing the results of tests under which the semiconductor device of FIG. 1 and semiconductor device of FIG. 4 are allowed to stand in a high-temperature and high-humidity atmosphere.
Figure 4:
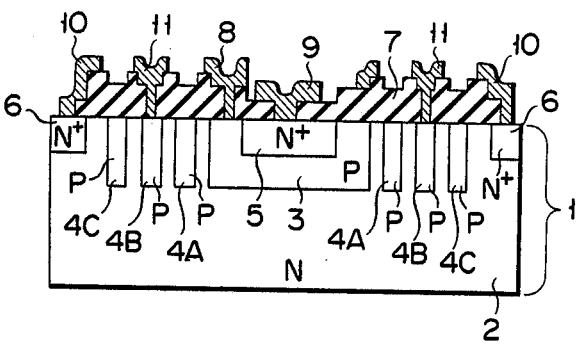
FIG. 4 is a cross-sectional view showing a conventional semiconductor device.

FIG. 3 is a graph showing change in a leakage current ($I_{CBO}$) when the semiconductor device of this invention and conventional device were allowed to stand for 500 hours in the above-mentioned atmosphere. In the graph of FIG. 3, the ordinate denotes the value of leakage current $I_{CBO}$ after these devices were allowed for 500 hours under the above-mentioned conditions, and the abscissa denotes the value in initial leakage current Initial-$I_{CBO}$ ($\mu$A) before these devices are tested under the above-mentioned conditions. In FIG. 3, mark x indicates values obtained in connection with the device of this invention (FIG. 1) and mark o indicates values obtained in connection with the conventional device (FIG. 4).

As evident from FIG. 3 the semiconductor device of this invention reveals a very small change in leakage current $I_{CBO}$ even after it was allowed to stand for 500 hours under the above-mentioned conditions (that is, a very high damp-proof characteristic is manifested). On the other hand, the conventional device reveals a greater increase in leakage current $I_{CBO}$.

These semiconductor devices (FIGS. 1 and 4) were examined in 168 and 500 hours, for the occurrence of defects, under the above-mentioned conditions. The results of this examination are shown in Table 1.

TABLE 1

| Devices allowed to stand | Device of this invention | Conventional device |
| --- | --- | --- |
| 168 hours | 0% | 10% |

TABLE 1-continued

| Devices allowed to stand | Device of this invention | Conventional device |
| --- | --- | --- |
| 500 hours | 0% | 90% |

As evident from Table 1, the conventional semiconductor device reveals a percent defective of 10% up to 168 hours and 90% after 500 hours, while the device of this invention reveals no defect after 500 hours.

Incidentally, the semiconductor devices used for the above examination were both of a resin-molding type.

As will be seen from the above description, according to this invention, there is provided a semiconductor device which is highly durable, excellent in damp-proof characteristics and high in withstand voltage and which involves no spark between the electrodes upon the measurement of its withstand voltage.

Although the embodiment of this invention has been explained with respect to the planar transistor, it may equally be applied to a planar diode or the like.

While the invention has been described in connection with what is presently considered to be the most practical and preferred embodiment, it is understood that the invention is not to be limited to the disclosed embodiment but, on the contrary, is intended to cover various modifications and equivalent arrangements included within the scope of the appended claims which scope is to be accorded the broadest interpretation so as to encompass all such modifications and equivalent structures.

What is claimed is:

1. A semiconductor device comprising:
    a first region formed in a semiconductor substrate, said semiconductor substrate being of a first conductivity type and said first region being of a second conductivity type;
    a second region of the second conductivity type formed to surround the outer side of said first region, said second region being a guard ring for said first region;
    an insulating film formed on the surface of the semiconductor substrate;
    a first electrode formed on said insulating film, said first electrode being in ohmic contact with said first region; and
    a metal film formed on said surface portion of said insulating film situated above said second region, said metal film being electrically isolated from elements of said semiconductor device including said second region.

2. A semiconductor device according to claim 1, in which said second region has a ring-like shape which surrounds said first region.

3. A semiconductor device according to claim 1, in which said second region is exposed on the surface of said semiconductor substrate.

4. A semiconductor device according to claim 2, in which said second region is exposed on the surface of said semiconductor substrate.

5. A semiconductor device according to claim 1, in which plural regions are provided for said second region.

6. A semiconductor device according to claim 1, in which said second region comprises a plurality of coaxial ring-shaped regions each of which surrounds said first region.

7. A semiconductor device according to claim 3, in which plural regions are provided for said second region.

8. A semiconductor device according to claim 3, in which said second region comprises a plurality of coaxial ring-shaped regions each of which surrounds said first region.

9. A semiconductor device according to claim 5, in which said metal film is formed on that surface portion of said insulating film which is situated above said second region nearest to said first region.

10. A semiconductor device according to claim 6, in which said metal film is formed on that surface portion of said insulating film which is situated above said second region nearest to said first region.

11. A semiconductor device according to claim 2, which is of a planar, bipolar type.

12. A semiconductor device according to claim 3, which is of a planar, bipolar type.

13. A semiconductor device according to claim 5, which is of a planar, bipolar type.

14. A semiconductor device according to claim 6, which is of a planar, bipolar type.

15. A semiconductor device according to claim 9, which is of a planar, bipolar type.

* * * * *